US012321848B2

(12) United States Patent
Sekiya et al.

(10) Patent No.: US 12,321,848 B2
(45) Date of Patent: Jun. 3, 2025

(54) SIGNAL PROCESSING CIRCUIT, SIGNAL PROCESSING DEVICE, AND SIGNAL PROCESSING METHOD USING LOGIC CIRCUIT

(71) Applicant: SONY CORPORATION, Tokyo (JP)

(72) Inventors: Akito Sekiya, Kanagawa (JP); Tomohiro Matsumoto, Kanagawa (JP); Hiroyuki Yamagishi, Kanagawa (JP); Yasushi Fujinami, Kanagawa (JP); Yusuke Oike, Kanagawa (JP); Ryoji Ikegaya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 1046 days.

(21) Appl. No.: 17/250,310

(22) PCT Filed: Jul. 5, 2019

(86) PCT No.: PCT/JP2019/026912
§ 371 (c)(1),
(2) Date: Dec. 31, 2020

(87) PCT Pub. No.: WO2020/013101
PCT Pub. Date: Jan. 16, 2020

(65) Prior Publication Data
US 2021/0376836 A1     Dec. 2, 2021

(30) Foreign Application Priority Data
Jul. 10, 2018  (JP) .................. 2018-130692

(51) Int. Cl.
*H03K 19/20*     (2006.01)
*G06N 3/048*     (2023.01)

(52) U.S. Cl.
CPC ............. *G06N 3/048* (2023.01); *H03K 19/20* (2013.01)

(58) Field of Classification Search
CPC ......... H03M 1/50; H03M 1/82; G04F 10/005; G06F 7/5443; G06N 3/048; G06G 7/16
See application file for complete search history.

(56) References Cited

U.S. PATENT DOCUMENTS

| 4,774,479 A | 9/1988 | Tateishi |
| 5,929,681 A | 7/1999 | Suzuki |

(Continued)

FOREIGN PATENT DOCUMENTS

| CN | 102520338 A | 6/2012 |
| CN | 106372605 A | 2/2017 |

(Continued)

OTHER PUBLICATIONS

International Search Report and Written Opinion of PCT Application No. PCT/JP2019/026912, issued on Sep. 24, 2019, 06 pages of ISRWO.

*Primary Examiner* — Matthew D Sandifer
(74) *Attorney, Agent, or Firm* — CHIP LAW GROUP

(57) ABSTRACT

A signal processing circuit outputs, in a case where a first timing at which a first input signal changes is earlier than or same as a second timing at which a second input signal changes, a first output signal at the first timing and a second output signal at the second timing, and outputs, in a case where the first timing is later than the second timing, the first output signal and the second output signal at the second timing.

13 Claims, 12 Drawing Sheets

(56) References Cited

U.S. PATENT DOCUMENTS

| | | |
|---|---|---|
| 6,339,345 B1 | 1/2002 | Eto |
| 6,501,315 B1 * | 12/2002 | Nguyen ................. H03K 3/037 |
| | | 327/217 |
| 2003/0117180 A1 | 6/2003 | Nasu |
| 2004/0012412 A1 | 1/2004 | Takahashi |
| 2019/0171418 A1 * | 6/2019 | Morie .................... G06N 3/049 |

FOREIGN PATENT DOCUMENTS

| | | |
|---|---|---|
| JP | 05-210650 A | 1/1977 |
| JP | 05-290014 A | 7/1977 |
| JP | 63-119319 A | 5/1988 |
| JP | 2534686 B2 * | 9/1996 |
| JP | 2007194368 A | 8/2007 |
| JP | 2012134686 A | 7/2012 |
| WO | 2018/034163 A1 | 2/2018 |

\* cited by examiner

FIG.7

| OUTPUT TIMING / INPUT TIMING | $t_{vout}^+$ | $t_{vout}^-$ |
|---|---|---|
| $t_{vin}^+$ IS EARLIER THAN OR SAME TIMING AS $t_{vin}^-$ | DELAYED FROM $t_{vin}^+$ BY DELAY TIME $\alpha$ | DELAYED FROM $t_{vin}^-$ BY DELAY TIME $\alpha$ |
| $t_{vin}^-$ IS EARLIER THAN $t_{vin}^+$ | DELAYED FROM $t_{vin}^-$ BY DELAY TIME $\alpha$ | |

SIGNAL PROCESSING CIRCUIT, SIGNAL PROCESSING DEVICE, AND SIGNAL PROCESSING METHOD USING LOGIC CIRCUIT

CROSS REFERENCE TO RELATED APPLICATIONS

This application is a U.S. National Phase of International Patent Application No. PCT/JP2019/026912 filed on Jul. 5, 2019, which claims priority benefit of Japanese Patent Application No. JP 2018-130692 filed in the Japan Patent Office on Jul. 10, 2018. Each of the above-referenced applications is hereby incorporated herein by reference in its entirety.

FIELD

The present disclosure relates to a signal processing circuit, a signal processing device, and a signal processing method.

BACKGROUND

Patent Literature 1 describes a multiply-accumulate operation device that represents operation result information by using a time difference between two signals. The multiply-accumulate operation device described in Patent Literature 1 is applicable to a neural network circuit. A neural network circuit has a mutually connected multiple layer configuration that includes a plurality of layers each including a plurality of multiply-accumulate operation circuits. In addition, a signal processing circuit that performs various types of signal processing is provided between one layer and another layer. Examples of various types of signal processing include activation function arithmetic processing and maximum pooling processing (Max Pooling).

The various types of signal processing described above are performed by a digital signal processing circuit. Therefore, before performing the various types of signal processing described above, there is a need to use a time-to-digital converter circuit that converts two signals representing information with a time difference into a digital signal. This time-to-digital converter circuit corresponds to an analog-to-digital (A/D) converter circuit. Furthermore, after performing the above-described various types of signal processing, there is a need to use a digital-to-time converter circuit that converts a digital signal into two signals representing information with a time difference. This digital-to-time converter circuit corresponds to a digital-to-analog (D/A) converter circuit.

CITATION LIST

Patent Literature

Patent Literature 1: WO 2018/034163 A

SUMMARY

Technical Problem

Unfortunately, however, the time-to-digital converter circuit and the digital-to-time converter circuit both consume a large amount of power.

In view of this, the present disclosure proposes a signal processing circuit, a signal processing device, and a signal processing method capable of suppressing power consumption.

Solution to Problem

According to the present disclosure, a signal processing circuit is provided that outputs, in a case where a first timing at which a first input signal changes is earlier than or same as a second timing at which a second input signal changes, a first output signal at the first timing and a second output signal at the second timing, and which outputs, in a case where the first timing is later than the second timing, the first output signal and the second output signal at the second timing.

Moreover, according to the present disclosure, a signal processing device is provided that includes a multiply-accumulate operation circuit that performs a first multiply-accumulate operation of individually multiplying and adding a plurality of signals by coefficients of a first group and outputs a first signal and that performs a second multiple-accumulate operation of individually multiplying and adding the plurality of signals by coefficients of a second group and outputs a second signal; and a signal processing circuit that outputs, in a case where a first timing at which the first signal changes is earlier than or same as a second timing at which the second signal changes, a first output signal at the first timing and a second output signal at the second timing, and that outputs, in a case where the first timing is later than the second timing, the first output signal and the second output signal at the second timing.

Advantageous Effects of Invention

According to the present disclosure, it is possible to suppress power consumption. It should be noted that the effects described herein are not necessarily limited and may be any of the effects described in the present disclosure.

BRIEF DESCRIPTION OF DRAWINGS

FIG. 7 is a diagram illustrating a relationship between input timings and output timings of the activation function circuit of the neural network device according to the first embodiment of the present disclosure.

DESCRIPTION OF EMBODIMENTS

Embodiments of the present disclosure will be described below in detail with reference to the drawings. In each of the following embodiments, the same parts are denoted by the same reference symbols, and a repetitive description thereof will be omitted.

First Embodiment

[Configuration of Neural Network Device According to First Embodiment]

Figure 1:
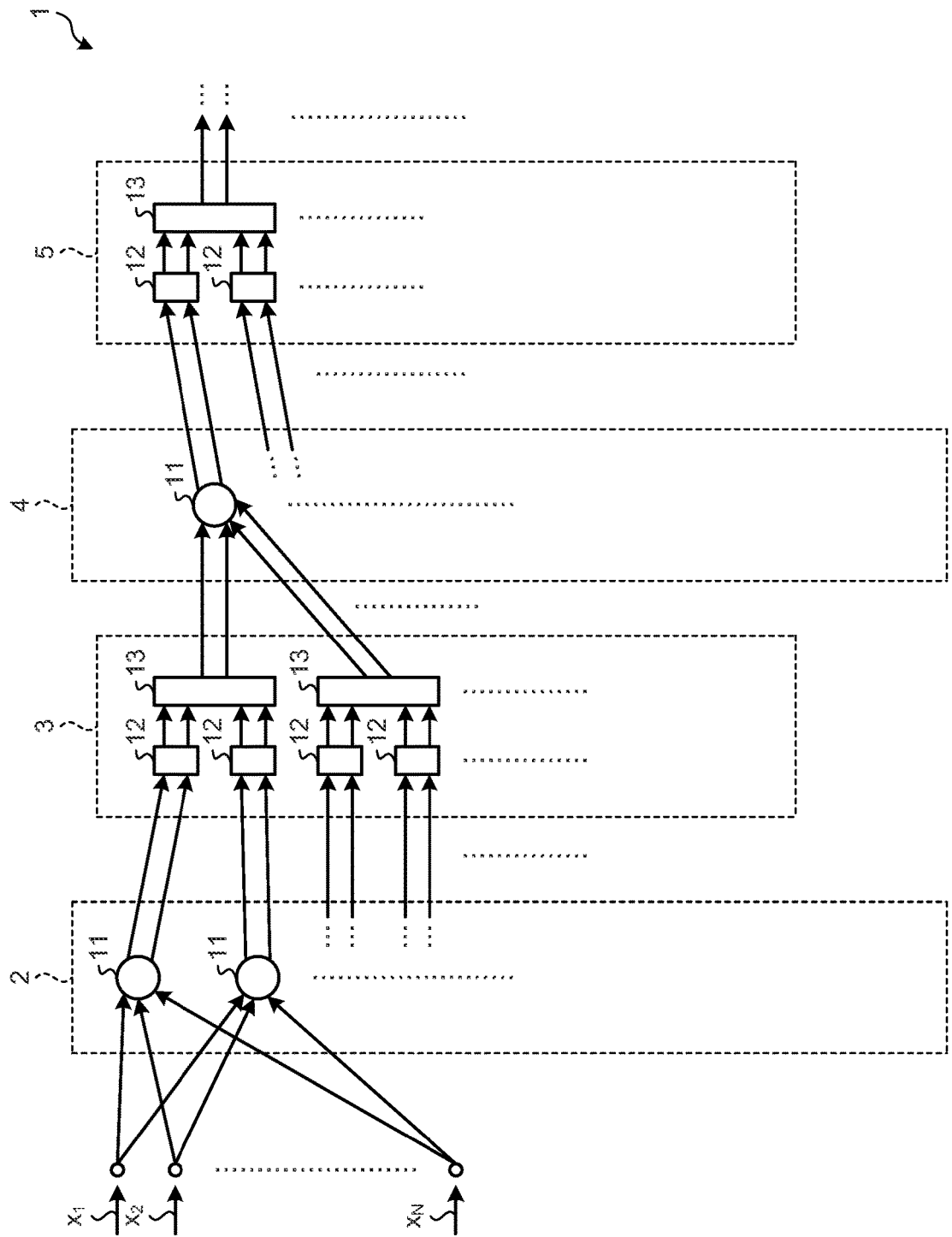
FIG. 1 is a diagram illustrating a configuration of a neural network device according to a first embodiment of the present disclosure.

FIG. 1 is a diagram illustrating a configuration of a neural network device according to a first embodiment of the present disclosure. A neural network device 1 includes a first layer circuit 2, a first interlayer circuit 3, a second layer circuit 4, and a second interlayer circuit 5.

The neural network device 1 is an example of a signal processing device of the present disclosure.

In the first embodiment, the neural network device 1 includes two layers, namely, the first layer circuit 2 and the second layer circuit 4. However, the present disclosure is not limited to this configuration. The neural network device 1 may include three or more layers. Furthermore, the neural network device 1 may be formed on a semiconductor chip (die).

The first layer circuit 2 performs a multiply-accumulate operation on a plurality of input signals $x_i$ (i is a natural number of 1 to N; N is a natural number of 2 or more), and outputs a signal representing a result of the operation to the first interlayer circuit 3. The first interlayer circuit 3 performs the processing described below on the output signal from the first layer circuit 2, and outputs a signal representing the processing result to the second layer circuit 4. The second layer circuit 4 performs a multiply-accumulate operation on the output signal from the first interlayer circuit 3, and outputs a signal representing the processing result to the second interlayer circuit 5. The second interlayer circuit 5 performs the processing described below on the output signal from the second layer circuit 4, and outputs a signal representing the processing result to a subsequent circuit.

The first layer circuit 2 includes a plurality of multiply-accumulate operation circuits 11. The first interlayer circuit 3 includes a plurality of activation function circuits 12 and a plurality of Max Pooling circuits 13. The second layer circuit 4 includes a plurality of multiply-accumulate operation circuits 11. The second interlayer circuit 5 includes a plurality of activation function circuits 12 and a plurality of Max Pooling circuits 13.

The activation function circuit 12 is an example of a signal processing circuit of the present disclosure. The Max Pooling circuit 13 is an example of a second signal processing circuit of the present disclosure. The multiply-accumulate operation circuit 11 is an example of a multiply-accumulate operation circuit of the present disclosure.

[Configuration and Operation of Multiply-Accumulate Operation Circuit]

Figure 2:
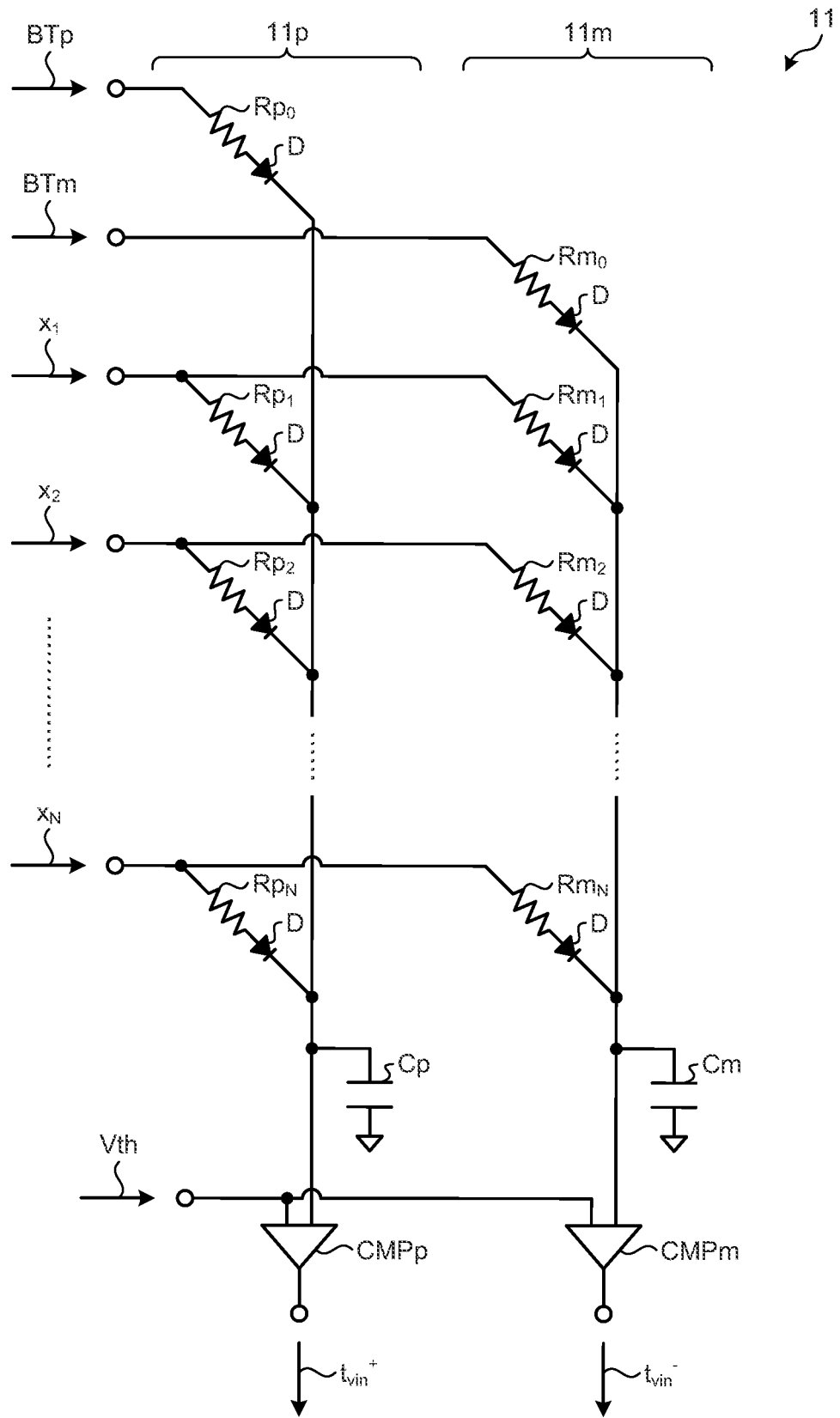
FIG. 2 is a diagram illustrating a configuration of a multiply-accumulate operation circuit of the neural network device according to the first embodiment of the present disclosure.

FIG. 2 is a diagram illustrating a configuration of a multiply-accumulate operation circuit of the neural network device according to the first embodiment of the present disclosure. The multiply-accumulate operation circuit 11 includes a first multiply-accumulate operation circuit 11p and a second multiply-accumulate operation circuit 11m.

The multiply-accumulate operation circuit 11 is a time-axis multiply-accumulate operation circuit representing the operation result information by the time difference between a positive absolute value signal $t_{vin}^+$ which is an output signal from the first multiply-accumulate operation circuit 11p and a negative absolute value signal $t_{vin}^-$ which is an output signal from the second multiply-accumulate operation circuit 11m.

The first multiply-accumulate operation circuit 11p includes a capacitor Cp having one end electrically connected to a standard potential. An example of the standard potential is ground potential, but the present disclosure is not limited to this. Furthermore, the capacitor Cp may be the gate capacitance of another storage device, for example, a MOS transistor.

The first multiply-accumulate operation circuit 11p includes a resistor $Rp_0$. The first multiply-accumulate operation circuit 11p also includes a diode D for backflow prevention, to which an anode is electrically connected to one end of the resistor $Rp_0$ while a cathode is electrically connected to the other end of the capacitor Cp. A bias voltage BTp is input to the other end of the resistor $Rp_0$. Accordingly, a current corresponding to the bias voltage BTp and the resistance value of the resistor $Rp_0$ is supplied to the capacitor Cp.

The first multiply-accumulate operation circuit 11p includes a plurality of resistors $Rp_i$ (i is a natural number 1 to N; N is a natural number of 2 or more). In addition, the first multiply-accumulate operation circuit 11p includes a plurality of diodes D for backflow prevention, in which an anode is electrically connected to one end of the resistor $Rp_i$ while a cathode is electrically connected to the other end of the capacitor Cp. An input signal $x_i$ is input to the other end of the resistor $Rp_i$. Accordingly, a current corresponding to the voltage of the input signal $x_i$ and the resistance value of the resistor $Rp_i$ is supplied to the capacitor Cp, increasing the voltage of the capacitor Cp. The input signal $x_i$ may be a pulse width modulated signal.

Consequently, the first multiply-accumulate operation circuit 11p performs the multiply-accumulate operation of the following Formula (1). In Formula (1), $w_i$ is a weighting factor and is determined by the resistance value of the resistance $Rp_i$ (more specifically, the reciprocal of the resistance value). In the first multiply-accumulate operation circuit 11p, $w_i$ is a coefficient representing a positive load.

$$\sum_{i=1}^{N} w_i x_i \tag{1}$$

The resistance value of the resistor $Rp_i$ may be switchable or changeable.

The first multiply-accumulate operation circuit 11p includes a comparator CMPp. The comparator CMPp outputs a low-level signal $t_{vin}^+$ when the voltage of the capacitor Cp is lower than a threshold voltage Vth. The comparator CMPp outputs a high-level signal $t_{vin}^+$ when the voltage of the capacitor Cp is the threshold voltage Vth or more.

The larger the multiply-accumulate operation result, the faster the rise of the voltage of the capacitor Cp, leading to an earlier timing at which the first multiply-accumulate operation circuit 11p outputs the high-level signal $t_{vin}^+$. The smaller the multiply-accumulate operation result, the slower the rise of the voltage of the capacitor Cp, leading to the delayed timing at which the first multiply-accumulate operation circuit 11p outputs the high-level signal $t_{vin}^+$.

The second multiply-accumulate operation circuit 11m includes a capacitor Cm having one end electrically connected to the standard potential. The capacitor Cm may be the gate capacitance of another storage device, for example, a MOS transistor.

The second multiply-accumulate operation circuit 11m includes a resistor $Rm_0$. The second multiply-accumulate operation circuit 11m also includes a diode D for backflow prevention, in which the anode is electrically connected to one end of the resistor $Rm_0$ and the cathode is electrically connected to the other end of the capacitor Cm. A bias voltage BTm is input to the other end of the resistor $Rm_0$. Accordingly, a current corresponding to the bias voltage BTm and the resistance value of the resistor $Rm_0$ is supplied to the capacitor Cm.

The second multiply-accumulate operation circuit 11m includes a plurality of resistors $Rm_i$ (i is a natural number 1 to N; N is a natural number of 2 or more). In addition, the second multiply-accumulate operation circuit 11m includes a plurality of diodes D for backflow prevention, in which the anode is electrically connected to one end of the resistor $Rm_i$ while the cathode is electrically connected to the other end of the capacitor Cm. An input signal $x_i$ is input to the other end of the resistor $Rm_i$. Accordingly, a current corresponding to the voltage of the input signal $x_i$ and the resistance value of the resistor $Rm_i$ is supplied to the capacitor Cm, increasing the voltage of the capacitor Cm.

Consequently, the second multiply-accumulate operation circuit 11m performs the multiply-accumulate operation of the above-described Formula (1). In the second multiply-accumulate operation circuit 11m, $w_i$ is a coefficient representing an absolute value of the negative load.

The resistance value of the resistor $Rm_i$ may be switchable or changeable.

The second multiply-accumulate operation circuit 11m includes a comparator CMPm. The comparator CMPm outputs a low-level signal $t_{vin}^-$ when the voltage of the capacitor Cm is lower than the threshold voltage Vth. The comparator CMPm outputs a high-level signal $t_{vin}^-$ when the voltage of the capacitor Cm is the threshold voltage Vth or more.

The larger the multiply-accumulate operation result, the faster the rise of the voltage of the capacitor Cm, leading to an earlier timing at which the second multiply-accumulate operation circuit 11m outputs the high-level signal $t_{vin}^-$. The smaller the multiply-accumulate operation result, the slower the rise of the voltage of the capacitor Cm, leading to the delayed timing at which the second multiply-accumulate operation circuit 11m outputs the high-level signal $t_{vin}^-$.

The multiply-accumulate operation circuit 11 represents the operation result information by the time difference between the signal $t_{vin}^+$ and the signal $t_{vin}^-$.

[Configuration and Operation of Activation Function Circuit]

The activation function circuit 12 is a circuit that performs a nonlinear function operation on the signals $t_{vin}^+$ and $t_{vin}^-$, which are output signals from the multiply-accumulate operation circuit 11. In the first embodiment, the nonlinear function used is a Rectified Linear Unit (ReLU). ReLU is expressed by the following Formula (2). ReLU is sometimes referred to as a ramp function.

$$ReLU(x) = \begin{cases} x(x \geq 0) \\ 0(x < 0) \end{cases} \tag{2}$$

Figure 3:
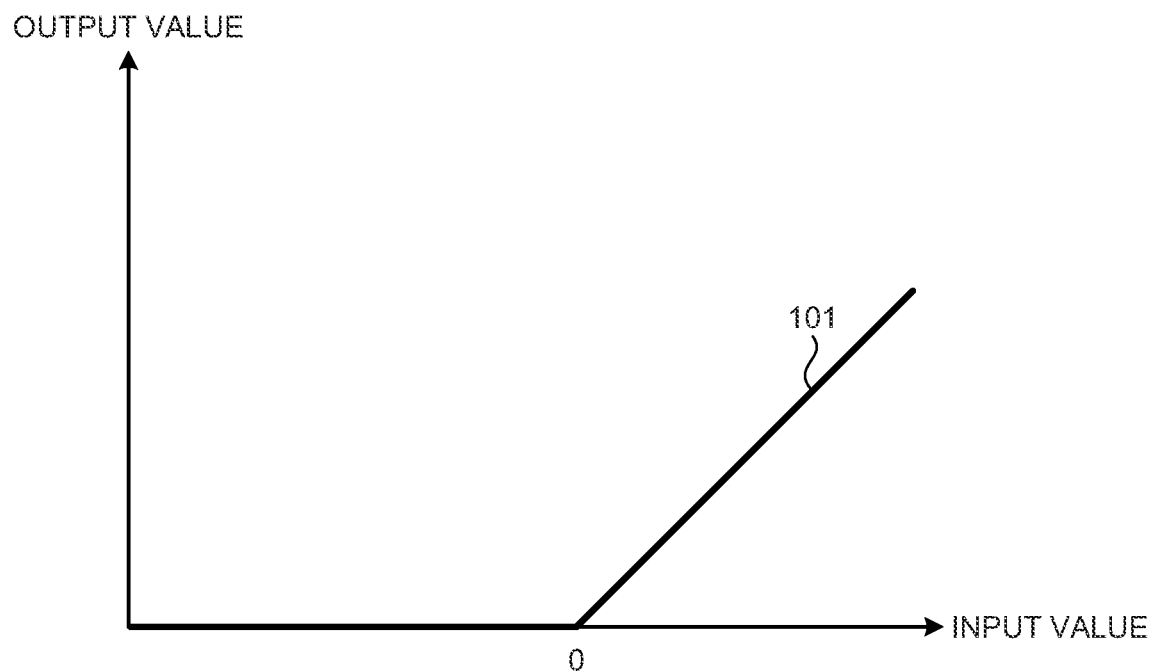
FIG. 3 is a diagram illustrating input/output characteristics of ReLU.

FIG. 3 is a diagram illustrating input/output characteristics of ReLU. As illustrated in Graph 101 of FIG. 3, an output value is 0 when an input value is smaller than 0. When the input value is 0 or more, the output value will be the equal to the input value.

Figure 4:
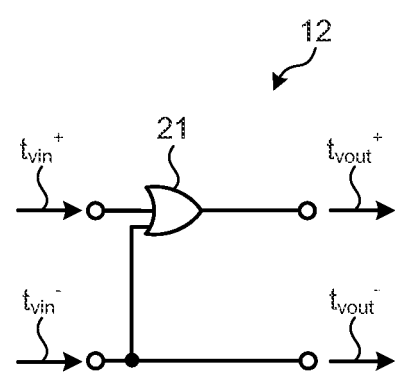
FIG. 4 is a diagram illustrating a configuration of an activation function circuit of the neural network device according to the first embodiment of the present disclosure.

FIG. 4 is a diagram illustrating a configuration of an activation function circuit of the neural network device according to the first embodiment of the present disclosure. The activation function circuit 12 includes a logic circuit.

Logic circuits are roughly classified into combinational circuits and sequential circuits. A combinational circuit is a circuit in which the current output signal depends only on the current input signal and does not depend on the past input signal. Examples of the combinational circuit include a logical OR circuit (OR gate circuit) and a logical AND circuit (AND gate circuit). A sequential circuit is a circuit in which the current output signal depends on both the current input signal and the past input signal. Examples of the sequential circuit include a D-type flip-flop and an RS-type flip-flop.

As illustrated in FIG. 4, the activation function circuit 12 includes a logical OR circuit (OR gate circuit) 21 which is a combinational circuit.

The logical OR circuit 21 is an example of a first logic circuit of the present disclosure.

The logical OR circuit 21 performs a logical OR operation on the signal $t_{vin}^+$ and the signal $t_{vin}^-$, and then outputs a signal $t_{vout}^+$ which is a result of the logical OR operation.

The activation function circuit 12 outputs a signal $t_{vin}^-$ as it is as a signal $t_{out}^-$.

Figure 5:
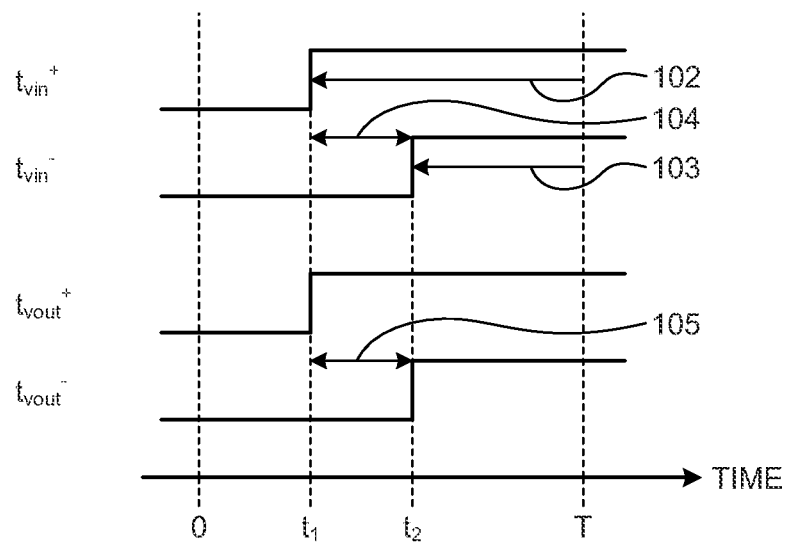
FIG. 5 is a timing diagram illustrating operation timings of the activation function circuit of the neural network device according to the first embodiment of the present disclosure.

FIG. 5 is a timing diagram illustrating operation timings of the activation function circuit of the neural network device according to the first embodiment of the present disclosure. Specifically, FIG. 5 is a diagram illustrating an operation timing of the activation function circuit 12 when the rising timing of the signal $t_{vin}^+$ is earlier than the rising timing of the signal $t_{vin}^-$.

The signal $t_{vin}^+$ rises from a low level to a high level at a timing $t_1$. Time 102 between the timing $t_1$ and a predetermined timing T corresponds to the positive absolute value which is the operation result of the first multiply-accumulate operation circuit 11p (refer to FIG. 2).

The signal $t_{vin}^-$ rises from a low level to a high level at a timing $t_2$ after the timing $t_1$. Time 103 between the timing $t_2$ and the predetermined timing T corresponds to a negative absolute value which is an operation result of the second multiply-accumulate operation circuit $11m$ (refer to FIG. 2).

In addition, the multiply-accumulate operation circuit 11 represents multiply-accumulate operation result information by a time difference 104 (positive time difference) between the timing $t_1$ and the timing $t_2$.

The logical OR circuit 21 outputs a high-level signal $t_{vout}^+$ because the signal $t_{vin}^+$ rises to a high level at the timing $t_1$.

The activation function circuit 12 outputs a high-level signal $t_{out}^-$ because the signal $t_{vin}^-$ rises to a high level at the timing $t_2$.

Therefore, a time difference 105 between the signal $t_{vout}^+$ and the signal $t_{out}^-$ is the same as the time difference 104 between the signal $t_{vin}^+$ and the signal $t_{vin}^-$.

Figure 6:
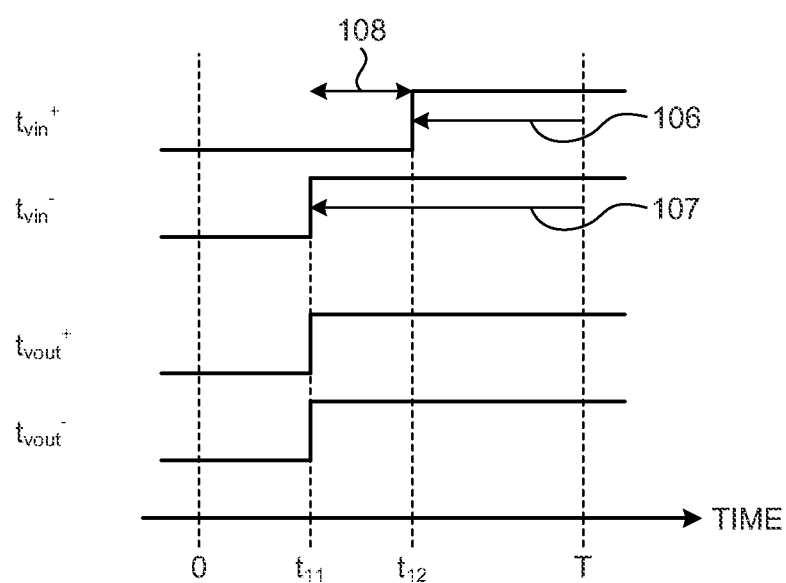
FIG. 6 is a timing diagram illustrating operation timings of the activation function circuit of the neural network device according to the first embodiment of the present disclosure.

FIG. 6 is a timing diagram illustrating operation timings of the activation function circuit of the neural network device according to the first embodiment of the present disclosure. Specifically, FIG. 6 is a diagram illustrating an operation timing of the activation function circuit 12 when the rising timing of the signal $t_{vin}^+$ is later than the rising timing of the signal $t_{vin}^-$.

The signal $t_{vin}^-$ rises from a low level to a high level at a timing $t_{11}$. Time 107 between the timing $t_{11}$ and the predetermined timing T corresponds to an operation result of the second multiply-accumulate operation circuit $11m$.

The signal $t_{vin}^+$ rises from a low level to a high level at a timing $t_{12}$ after the timing $t_{11}$. Time 106 between the timing $t_{12}$ and the predetermined timing T corresponds to an operation result of the first multiply-accumulate operation circuit $11p$.

In addition, the multiply-accumulate operation circuit 11 represents multiply-accumulate operation result information by a time difference 108 (negative time difference) between the timing $t_{11}$ and the timing $t_{12}$.

The logical OR circuit 21 outputs a high-level signal $t_{vout}^+$ because the signal $t_{vin}^-$ rises to a high level at the timing $t_{11}$.

The activation function circuit 12 outputs a high-level signal $t_{out}^-$ because the signal $t_{vin}^-$ rises to a high level at the timing $t_{11}$.

Therefore, the signal $t_{vout}^+$ and the signal $t_{out}^-$ are output at the same timing.

FIG. 7 is a diagram illustrating a relationship between input timings and output timings of the activation function circuit of the neural network device according to the first embodiment of the present disclosure.

In a case where the rising timing of the signal $t_{vin}^+$ is earlier than or the same as the rising timing of the signal $t_{vin}^-$, the rising timing of the signal $t_{vout}^+$ will be delayed by a delay time a compared to the rising timing of the signal $t_{vin}^+$. Here, the delay time a is the propagation delay time of the activation function circuit 12. Furthermore, the rising timing of the signal $t_{out}^-$ is delayed by the delay time a compared with the rising timing of the signal $t_{vin}^-$.

In a case where the rising timing of the signal $t_{vin}^+$ is later than the rising timing of the signal $t_{vin}^-$, the rising timing of the signal $t_{vout}^+$ will be delayed by a delay time a compared with the rising timing of the signal $t_{vin}^-$. Similarly, the rising timing of the signal $t_{out}^-$ will be delayed by a delay time a compared with the rising timing of the signal $t_{vin}^-$.

As described above, the activation function circuit 12 can perform the activation function processing without the need to use a time-to-digital converter circuit. Furthermore, the activation function circuit 12 can output a signal resulted from the activation function operation to the subsequent circuit without the need to use a digital-to-time converter circuit. In this manner, the activation function circuit 12 can eliminate the need for a time-to-digital converter circuit and a digital-to-time converter circuit. Accordingly, the activation function circuit 12 can suppress the power consumption of the time-to-digital converter circuit and the digital-to-time converter circuit.

Furthermore, the activation function circuit 12 can eliminate the need for the time-to-digital converter circuit and the digital-to-time converter circuit. Accordingly, the activation function circuit 12 can downsize the circuit of the neural network device 1 by the area occupied by the time-to-digital converter circuit and the digital-to-time converter circuit.

Furthermore, the activation function circuit 12 can be attained by a combinational circuit (a logical OR circuit 21 in the first embodiment). Accordingly, the activation function circuit 12 can downsize the circuit and suppress the power consumption as compared with a case where the nonlinear function processing is implemented by the digital signal processing circuit after the time-digital conversion.

Furthermore, the activation function circuit 12 can suppress power consumption and downsize the circuit. Accordingly, the activation function circuit 12 can increase the layers of the neural network device 1.

[Configuration and Operation of Max Pooling Circuit]

The Max Pooling circuit 13 is a circuit that performs Max Pooling processing which extracts and outputs the larger of the output signals of the two activation function circuits 12.

Figure 8:
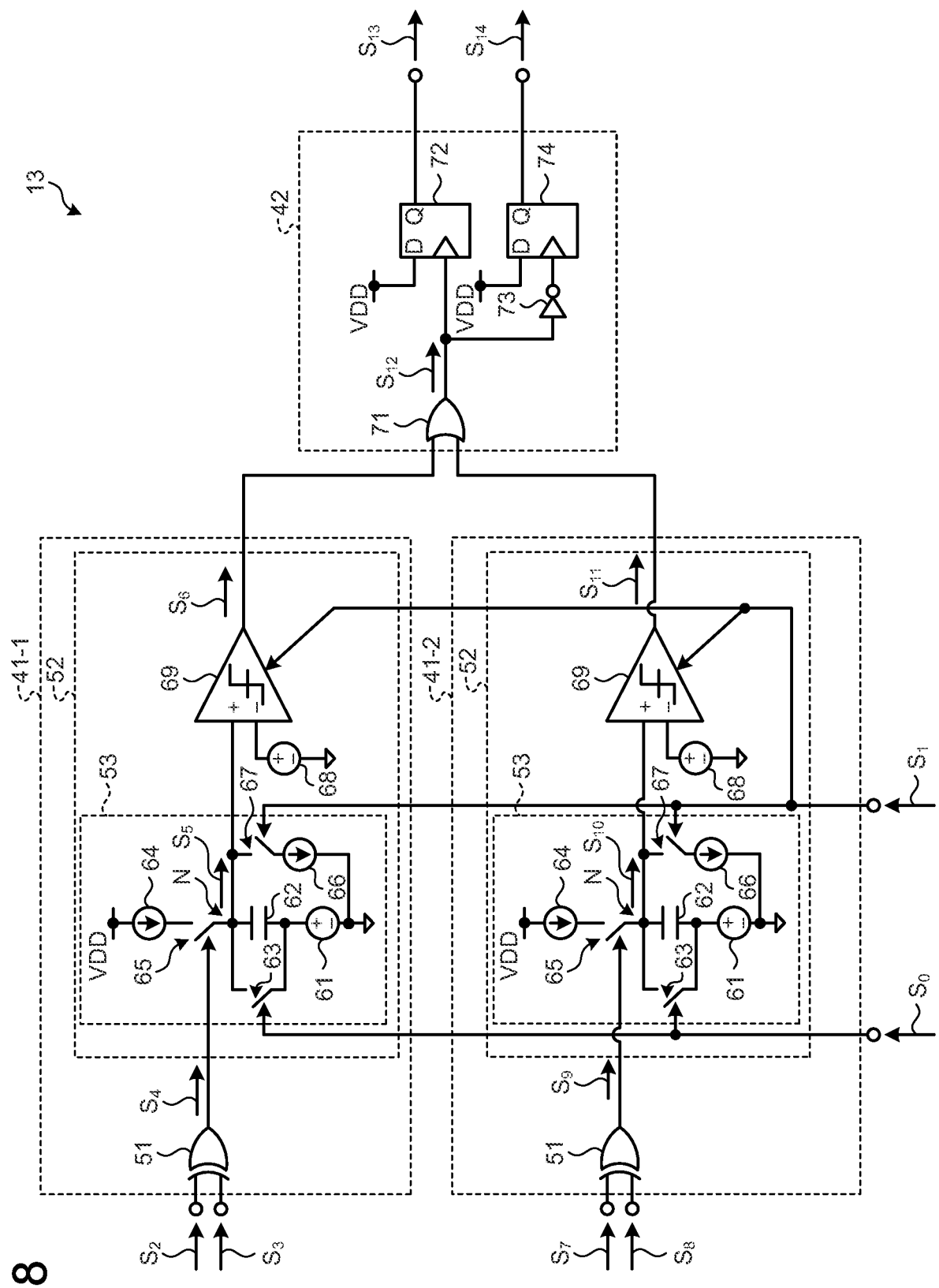
FIG. 8 is a diagram illustrating a configuration of a Max Pooling circuit of the neural network device according to the first embodiment of the present disclosure.

FIG. 8 is a diagram illustrating a configuration of a Max Pooling circuit of the neural network device according to the first embodiment of the present disclosure.

The Max Pooling circuit 13 includes two first circuits 41-1 and 41-2 and a second circuit 42.

One circuit, namely, the first circuit 41-1 includes a first time-length signal output circuit 51 that outputs a signal $S_4$ being a first time-length signal representing a time length between a first timing at which a signal $S_2$ being a first input signal changes and a second timing at which a signal $S_3$ being a second input signal changes.

Furthermore, the first circuit 41-1 includes a second time-length signal output circuit 52 that outputs a signal $S_4$ as a second time-length signal $S_6$ at a timing based on the signal $S_1$ which is an enable control signal.

The signals $S_2$ and $S_3$ correspond to signals $t_{vout}^+$ and $t_{vout}^-$, respectively, which are output signals of one activation function circuit 12.

The first time-length signal output circuit 51 is an exclusive OR circuit (XOR gate circuit) which is a combinational circuit that performs an exclusive OR operation on the signal $S_2$ and the signal $S_3$.

The second time-length signal output circuit 52 includes a charge/discharge circuit 53 that charges a capacitor 62 based on the signal $S_4$ and discharges the capacitor 62 based on the signal $S_1$ which is an enable control signal.

The charge/discharge circuit 53 includes a first constant voltage source 61 that outputs a reference potential Vref. Furthermore, the charge/discharge circuit 53 includes a capacitor 62 having one end electrically connected to the first constant voltage source 61 and the other end electrically connected to a node N.

Furthermore, the charge/discharge circuit 53 includes a first constant current source 64 having one end electrically connected to a power supply potential VDD on the high potential side. Furthermore, the charge/discharge circuit 53 includes a first switch 65 in which an input/output path is connected between the other end of the first constant current source 64 and the node N while a signal $S_4$ is supplied to a control terminal.

Furthermore, the charge/discharge circuit 53 further includes a second constant current source 66, one end of which is connected to a standard potential. Furthermore, the charge/discharge circuit 53 includes a second switch 67 in which an input/output path is connected between the node N and the other end of the second constant current source 66 while a signal $S_1$ is supplied to the control terminal.

Furthermore, the charge/discharge circuit 53 includes a third switch 63 in which input/output paths are connected to both ends of the capacitor 62 while a signal $S_0$ which is a reset signal is supplied to the control terminal.

The second time-length signal output circuit 52 includes a comparator 69 in which an inverting input terminal is electrically connected to a second constant voltage source 68 that outputs the reference potential Vref while a non-inverting input terminal is electrically connected to the node N.

The comparator 69 compares a signal $S_5$ with the reference potential Vref, and outputs a high-level signal $S_6$ during a period in which the signal $S_5$ is the reference potential Vref or more.

The other circuit, namely, the first circuit 41-2 includes a first time-length signal output circuit 51 that outputs a signal $S_9$ being a first time-length signal representing a time length between a first timing at which a signal $S_7$ being a first input signal changes and a second timing at which a signal $S_8$ being a second input signal changes.

Furthermore, the first circuit 41-2 includes a second time-length signal output circuit 52 that outputs the signal $S_9$ as a signal $S_{11}$ which is a second time-length signal at a timing based on the signal $S_1$.

The signals $S_7$ and $S_8$ correspond to signals $t_{vout}^+$ and $t_{vout}^-$, which are output signals of the other activation function circuit 12.

Since the circuit configuration of the first circuit 41-2 is similar to the circuit configuration of the first circuit 41-1, the description thereof will be omitted.

The second circuit 42 includes a logical OR circuit (OR gate circuit) 71 which is a combinational circuit that performs a logical OR operation on the signal $S_6$ and the signal $S_{11}$.

Furthermore, the second circuit 42 includes a D-type first flip-flop 72 which is a sequential circuit that holds a high level (power supply potential VDD) at a rising edge of a signal $S_{12}$ which is the output signal of the logical OR circuit 71 and outputs a signal $S_{13}$.

Furthermore, the second circuit 42 includes an inverting circuit (NOT gate circuit) 73, which is a combinational circuit that inverts the signal $S_{12}$. Furthermore, the second circuit 42 includes a D-type second flip-flop 74 which is a sequential circuit that holds a high level at a rising edge of the output signal of the inverting circuit 73 and outputs a signal $S_{14}$.

In the first embodiment, the second circuit 42 extracts and outputs the larger of the output signals of the two first circuits 41-1 and 41-2. However, the present disclosure is not limited to this. The second circuit 42 may extract and output the largest signal among the output signals of the three or more first circuits. For example, the logical OR circuit 71 may be a 3-input logical OR circuit, and the three first circuits may be electrically connected to the three inputs of the logical OR circuit 71.

Figure 9:
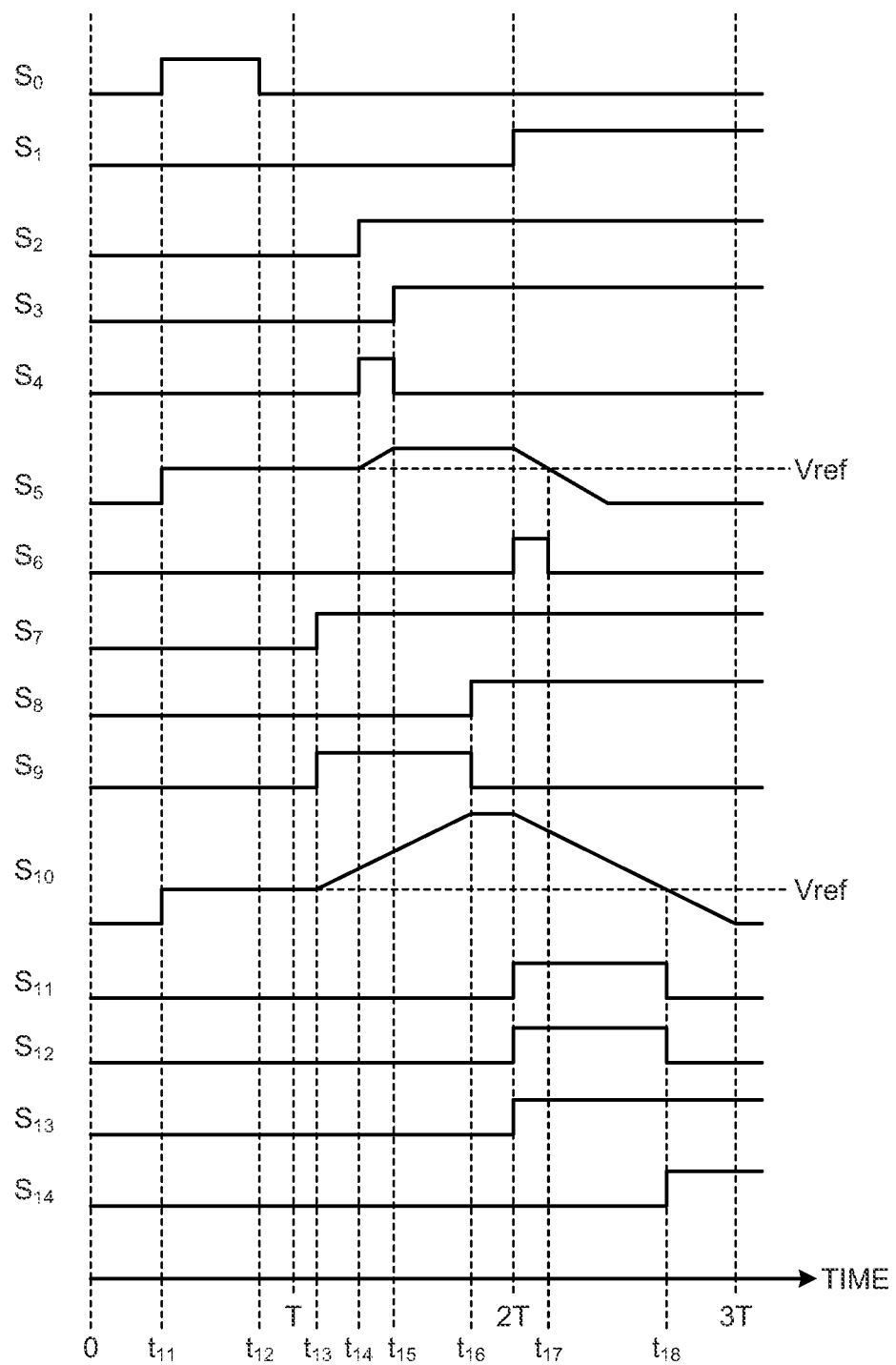
FIG. 9 is a timing diagram illustrating operation timings of the Max Pooling circuit of the neural network device according to the first embodiment of the present disclosure.

FIG. 9 is a timing diagram illustrating operation timings of the Max Pooling circuit of the neural network device according to the first embodiment of the present disclosure.

The period from a timing 0 to a predetermined timing T is the reset period. During the time from the timing $t_{11}$ to the timing $t_{12}$, a signal $S_0$ being the reset signal rises to a high level.

When the signal $S_0$ rises to a high level at the timing $t_{11}$, the third switch 63 in the first circuit 41-1 turns on, causing short-circuit on both ends of the capacitor 62. Accordingly, the signal $S_5$, having the potential of the node N, indicates the reference potential Vref.

Similarly, the third switch 63 in the first circuit 41-2 turns on, causing short-circuit in both ends of the capacitor 62. Accordingly, the signal $S_{10}$, which is the potential of the node N, indicates the reference potential Vref.

The period from the timing T to a predetermined timing 2T corresponds to a charge period.

At the timing $t_{13}$, the signal $S_7$, which is the first input signal of the first circuit 41-2, rises to a high level. Since the signal $S_7$ rises to a high level, the first time-length signal output circuit 51, which is an exclusive OR circuit, outputs a high level signal $S_9$. As the signal $S_9$ rises to a high level, the first switch 65 turns on. Since the first switch 65 turns on, the first constant current source 64 charges the capacitor 62. Accordingly, the signal $S_{10}$, which is the potential of the node N, rises linearly.

At a timing $t_{14}$, the signal $S_2$, which is the first input signal of the first circuit 41-1, rises to a high level. Since the signal $S_2$ rises to a high level, the first time-length signal output circuit 51, which is the exclusive OR circuit, outputs a high level signal $S_4$. As the signal $S_4$ rises to a high level, the first switch 65 turns on. Since the first switch 65 turns on, the first constant current source 64 charges the capacitor 62. Accordingly, the signal $S_5$, which is the potential of the node N, rises linearly.

At a timing $t_{15}$, the signal $S_3$, which is the second input signal of the first circuit 41-1, rises to a high level. Since the signal $S_3$ rises to a high level, the first time-length signal output circuit 51, which is an exclusive OR circuit, outputs a low level signal $S_4$. As the signal $S_4$ falls to a low level, the first switch 65 turns off. Since the first switch 65 is turned off, the capacitor 62 will not be charged. Accordingly, the signal $S_5$, which is the potential of the node N, stops rising and stays at a constant level.

Here, when the current value of the first constant current source 64 is Icharge, the capacitance value of the capacitor 62 is C, and a time length from the timing $t_{14}$ to the timing $t_{15}$ is ΔTcharge, the voltage Vc of the capacitor 62 is expressed by the following Formula (3):

$$Vc=(Icharge/C)*\Delta Tcharge+Vref \qquad (3)$$

At a timing $t_{16}$, the signal $S_8$, which is the second input signal of the first circuit 41-2, rises to a high level. Since the signal $S_8$ rises to a high level, the first time-length signal output circuit 51 being the exclusive OR circuit outputs the low level signal $S_9$. Since the signal $S_9$ falls to a low level, the first switch 65 turns off. Since the first switch 65 is turned off, the capacitor 62 will not be charged. Therefore, the signal $S_{10}$, which is the potential of the node N, stops rising to be at a constant level.

At this time, the voltage Vc of the capacitor 62 of the first circuit 41-2 is expressed by the above Formula (3).

The period from the timing 2T to a predetermined timing 3T is defined as an output period.

At the timing 2T, the signal $S_1$ being the enable control signal rises to a high level.

In the first circuit 41-1, the signal $S_1$ is at a high level, and thus, the second switch 67 turns on. Since the second switch 67 turns on, the second constant current source 66 discharges the capacitor 62. Accordingly, the signal $S_5$ having the potential of the node N falls linearly. At the timing 2T, the potential of the signal $S_5$ is higher than the reference potential Vref according to the above Formula (3). Accordingly, the comparator 69 outputs the high level signal $S_6$.

Similarly, in the first circuit 41-2, the signal $S_1$ is at a high level, and thus, the second switch 67 turns on. Since the second switch 67 turns on, the second constant current source 66 discharges the capacitor 62. Therefore, the signal $S_{10}$, which is the potential of the node N, descends linearly. At timing 2T, the potential of the signal $S_{10}$ is higher than the reference potential Vref according to the above Formula (3). Therefore, the comparator 69 outputs the high level signal $S_{11}$.

In the second circuit 42, since the signal $S_6$ and the signal $S_{11}$ rise to high levels, the logical OR circuit 71 outputs the high level signal $S_{12}$. Since the signal $S_{12}$ rises to a high level, the first flip-flop 72 holds a high level which is a predetermined potential (here, the power supply potential VDD) and outputs the high level signal $S_{13}$.

At a timing $t_{17}$, the signal $S_5$ having the potential of the node N of the first circuit 41-1 falls below the reference potential Vref. Accordingly, the comparator 69 outputs the low level signal $S_6$.

Here, when the current value of the second constant current source 66 is Idischarge, the time length ΔTdischarge from the timing 2T to the timing $t_{17}$ is expressed by the following Formula (4).

$$\Delta T \text{discharge} = \qquad (4)$$
$$(Vc - Vref)/(I\text{discharge}/C) = (I\text{charge}/I\text{discharge}) * \Delta T\text{charge}$$

Therefore, the time length ΔT discharge is directly proportional to the time length ΔT charge. That is, the discharge time is directly proportional to the charge time.

When Idischrage=Icharge, the charge/discharge circuit 53 can set the time length ΔTdischarge equal to the time length ΔTcharge. That is, the charge/discharge circuit 53 can set the discharge time equal to the charge time.

When Idischrage<Icharge, the charge/discharge circuit 53 can set the time length ΔTdischarge longer than the time length ΔTcharge. That is, the charge/discharge circuit 53 can set the discharge time longer than the charge time. With this setting, the charge/discharge circuit 53 can also attain an amplification function for input time information.

At a timing $t_{18}$, the signal $S_{10}$ having the potential of the node N of the first circuit 41-2 falls below the reference potential Vref. Accordingly, the comparator 69 outputs the low level signal $S_{11}$.

At this time, the time length ΔTdischarge from the timing 2T to the timing $t_{18}$ is expressed by the above Formula (4).

In the second circuit 42, since the signal $S_6$ and the signal $S_{11}$ fall to low levels, the logical OR circuit 71 outputs the low level signal $S_{12}$.

Since the timing of the rising edge of the signal $S_6$ and the timing of the rising edge of the signal $S_{11}$ match, the logical OR circuit 71 can output the signal $S_{12}$ having the same time length as the signal $S_{11}$ due to the logical OR of the signal $S_6$ and the signal $S_{11}$.

Since the signal $S_{12}$ falls to a low level, the inverting circuit 73 outputs a high level signal. The second flip-flop 74 holds a high level which is a predetermined potential (here, the power supply potential VDD) and outputs a high level signal $S_{14}$.

In a case where a pulse signal (signal $S_{12}$) instead of the differential signal (signal $S_{13}$ and signal $S_{14}$) would be sufficient as a signal to the next layer, the second circuit 42 can omit a first flip-flop 24, the inverting circuit 73, and a second flip-flop 25.

As described above, the Max Pooling circuit 13 extracts the signal $S_7$ and signal $S_8$, which are larger signals when comparing the signals $S_2$ and $S_3$ which are the output signals of one activation function circuit 12 and the signals $S_7$ and $S_8$ which are the output signals of the other activation function circuit 12. Subsequently, the Max Pooling circuit 13 outputs the signal $S_{13}$ and the signal $S_{14}$ having the same time difference as the time difference between the extracted signal $S_7$ and the signal $S_8$. With this configuration, the Max Pooling circuit 13 can implement the Max Pooling processing.

The Max Pooling circuit 13 can perform Max Pooling processing without the need to use a time-to-digital converter circuit. Furthermore, the Max Pooling circuit 13 can output a Max Pooling result signal to a subsequent circuit without the need to use a digital-to-time converter circuit. In this manner, the Max Pooling circuit 13 can eliminate the need for the time-to-digital converter circuit and the digital-to-time converter circuit. Accordingly, the Max Pooling circuit 13 can suppress the power consumption of the time-to-digital converter circuit and the digital-to-time converter circuit.

In addition, the Max Pooling circuit 13 can eliminate the need for the time-to-digital converter circuit and the digital-to-time converter circuit. Accordingly, the Max Pooling circuit 13 can downsize the circuit of the neural network device 1 by the area occupied by the time-to-digital converter circuit and the digital-to-time converter circuit.

Furthermore, the Max Pooling circuit 13 can suppress power consumption and downsize the circuit. Accordingly, the Max Pooling circuit 13 can increase the layers of the neural network device 1.

Furthermore, when the Max Pooling circuit 13 makes adjustment to achieve Idischrage<Icharge, the time length ΔT discharge can be set longer than the time length ΔTcharge. That is, the Max Pooling circuit 13 can set the discharge time longer than the charge time. With this setting, the Max Pooling circuit 13 can also amplify the input time information.

SUMMARY

As described above, the activation function circuit 12 can perform the activation function processing without the need to use a time-to-digital converter circuit. Furthermore, the activation function circuit 12 can output a signal resulted from the activation function operation to the subsequent circuit without the need to use a digital-to-time converter circuit. In this manner, the activation function circuit 12 can eliminate the need for a time-to-digital converter circuit and a digital-to-time converter circuit. Accordingly, the activation function circuit 12 can suppress the power consumption of the time-to-digital converter circuit and the digital-to-time converter circuit.

Furthermore, the activation function circuit 12 can eliminate the need for the time-to-digital converter circuit and the digital-to-time converter circuit. Accordingly, the activation function circuit 12 can downsize the circuit of the neural network device 1 by the area occupied by the time-to-digital converter circuit and the digital-to-time converter circuit.

Furthermore, the activation function circuit 12 can be attained by a combinational circuit (a logical OR circuit 21 in the first embodiment). Accordingly, the activation function circuit 12 can downsize the circuit and suppress the power consumption as compared with a case where the nonlinear function processing is implemented by the digital signal processing after the time-digital conversion.

Furthermore, the activation function circuit 12 can suppress power consumption and downsize the circuit. Accordingly, the activation function circuit 12 can increase the layers of the neural network device 1.

Second Embodiment

Figure 10:
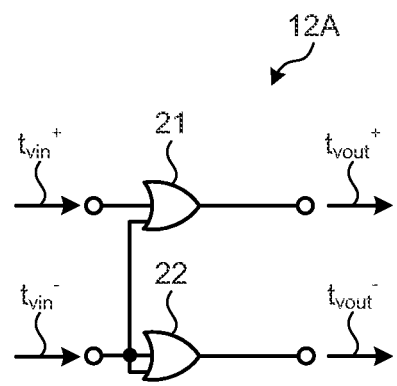
FIG. 10 is a diagram illustrating a configuration of an activation function circuit according to a second embodiment of the present disclosure.

FIG. 10 is a diagram illustrating a configuration of an activation function circuit according to a second embodiment of the present disclosure.

As compared with the activation function circuit 12 (refer to FIG. 4) of the first embodiment, an activation function circuit 12A further includes a logical OR circuit (OR gate circuit) 22.

The logical OR circuit 22 is an example of a second logic circuit of the present disclosure.

The logical OR circuit 22 performs a logical OR operation on the signal $t_{vin}^-$ and the signal $t_{vin}^-$, and outputs a signal $t_{out}^-$ which is a result of the logical OR operation. The logical sum (OR) of the signal $t_{vin}^-$ and the signal $t_{vin}^-$ is the same as the signal $t_{vin}^-$.

In the activation function circuit 12A, the delay time of the signal $t_{vout}^+$ is the delay time of the logical OR circuit 21, while the delay time of the signal $t_{out}^-$ is the delay time of the logical OR circuit 22. Here, the delay time of the logical OR circuit 21 and the delay time of the logical OR circuit 22 are the same.

Therefore, the activation function circuit 12A can suppress the difference between the delay time of the signal $t_{vout}^+$ and the delay time of the signal $t_{out}^-$.

Note that the activation function circuit 12A may include another combinational circuit, for example, a buffer circuit, instead of the logical OR circuit 22. However, from the viewpoint of suppressing the difference from the delay time of the logical OR circuit 21, the activation function circuit 12A preferably includes the logical OR circuit 22 having the same delay time as the delay time of the logical OR circuit 21.

Third Embodiment

Figure 11:
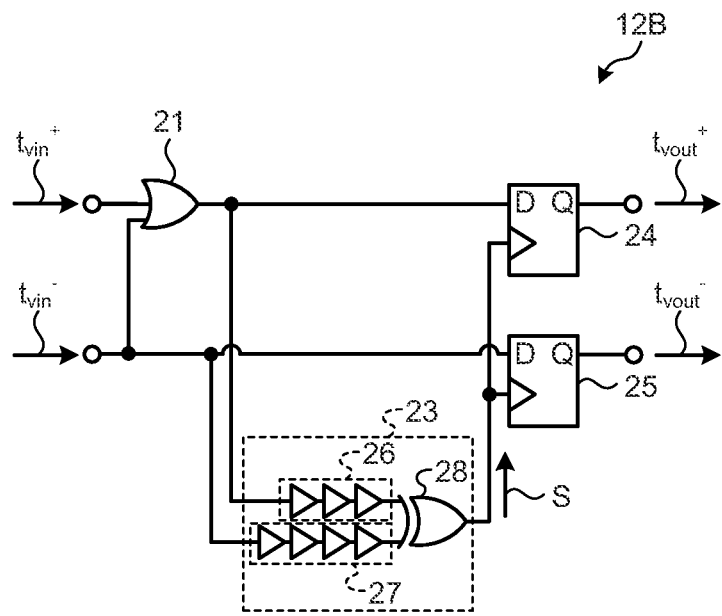
FIG. 11 is a diagram illustrating a configuration of an activation function circuit according to a third embodiment of the present disclosure.

FIG. 11 is a diagram illustrating a configuration of an activation function circuit according to a third embodiment of the present disclosure.

As compared with the activation function circuit 12 of the first embodiment (refer to FIG. 4), an activation function circuit 12B further includes a combinational circuit 23, a first flip-flop 24, and a second flip-flop 25.

The combinational circuit 23 is an example of a third logic circuit of the present disclosure. The first flip-flop 24 is an example of a first sequential circuit of the present disclosure. The second flip-flop 25 is an example of a second sequential circuit of the present disclosure.

The combinational circuit 23 includes a first buffer circuit group 26 having a plurality of buffer circuits (delay circuits) connected in multiple stages, a second buffer circuit group 27 having a plurality of buffer circuits (delay circuits) connected in multiple stages, and an exclusive OR circuit 28.

The first buffer circuit group 26 delays an output signal of the logical OR circuit 21 and outputs the signal to one input terminal of the exclusive OR circuit 28. The second buffer circuit group 27 delays the signal $t_{vin}^-$ and outputs the signal to the other input terminal of the exclusive OR circuit 28.

The D-type first flip-flop 24 holds the output signal of the logical OR circuit 21 at a rising edge and a falling edge of an output signal S of the combinational circuit 23, and outputs a signal $t_{vout}^+$.

The D-type second flip-flop 25 holds the signal $t_{vin}^-$ at the rising edge and the falling edge of the output signal S of the combinational circuit 23, and outputs a signal $t_{out}^-$.

The combinational circuit 23 includes the first buffer circuit group 26 and the second buffer circuit group 27 in order to ensure the setup time for the first flip-flop 24 and the second flip-flop 25.

The first buffer circuit group 26 delays the output signal of the logical OR circuit 21, while the second buffer circuit group 27 delays the signal $t_{vin}^-$. Accordingly, the output signal S of the exclusive OR circuit 28 is input to the first flip-flop 24 and the second flip-flop 25 at a timing later than the output signal and signal $t_{vin}^-$ of the logical OR circuit 21.

This ensures the setup time for the first flip-flop 24, making it possible to reliably hold the output signal of the logical OR circuit 21. Similarly, the setup time for the second flip-flop 25 is ensured, making it possible to reliably hold the signal $t_{vin}^-$.

Note that the signal $t_{vin}^+$ passes through the logical OR circuit 21 to be input to the first flip-flop 24, whereas the signal $t_{vin}^-$ is input to the second flip-flop 25 without passing through the logic circuit. Therefore, it is preferable to set the number of buffer circuits in the second buffer circuit group 27 larger than the number of buffer circuits in the first buffer circuit group 26. As illustrated as an example, the first buffer circuit group 26 includes three buffer circuits while the second buffer circuit group 27 includes four buffer circuits.

In the activation function circuit 12B, the first flip-flop 24 holds the output signal of the logical OR circuit 21 and outputs a signal $t_{vout}^+$. Furthermore, the second flip-flop 25 holds the signal $t_{vin}^-$ and outputs a signal $t_{out}^-$. Therefore, after the first flip-flop 24 holds the output signal of the logical OR circuit 21 and the second flip-flop 25 holds the signal $t_{vin}^+$, the multiply-accumulate operation circuit 11 (refer to FIG. 2) in the previous stage may stop the output of the signal $t_{vin}^+$ and the signal $t_{vin}^+$. With this configuration, the multiply-accumulate operation circuit 11 in the previous stage can start the subsequent multiply-accumulate operation.

This enables the activation function circuit 12B to achieve high-speed neural operation.

Fourth Embodiment

Figure 12:
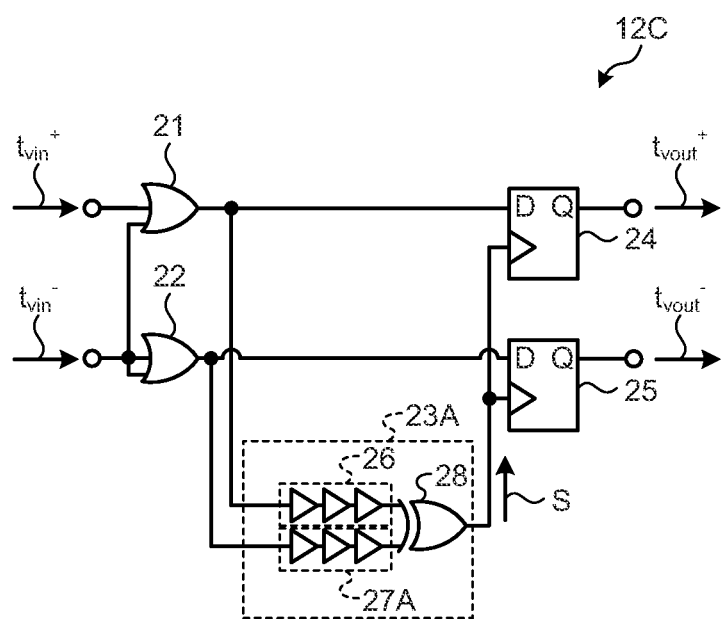
FIG. 12 is a diagram illustrating a configuration of an activation function circuit according to a fourth embodiment of the present disclosure.

FIG. 12 is a diagram illustrating a configuration of an activation function circuit according to a fourth embodiment of the present disclosure.

As compared with the activation function circuit 12B (refer to FIG. 11) of the third embodiment, an activation function circuit 12C further includes a logical OR circuit 22 (refer to FIG. 10 of the second embodiment). As compared with the activation function circuit 12B of the third embodiment, the activation function circuit 12C includes a combinational circuit 23A instead of the combinational circuit 23.

As compared with the combinational circuit 23 (refer to FIG. 11) of the third embodiment, the combinational circuit 23A includes a second buffer circuit group 27A instead of the second buffer circuit group 27.

In the activation function circuit 12C, the signal $t_{vin}^+$ passes through the logical OR circuit 21 to be input to the first flip-flop 24, and the signal $t_{vin}^-$ passes through the logical OR circuit 22 to be input to the second flip-flop 25.

Therefore, it is preferable to set the number of buffer circuits in the second buffer circuit group 27A equal to the number of buffer circuits in the first buffer circuit group 26. As illustrated as an example, the first buffer circuit group 26 includes three buffer circuits while the second buffer circuit group 27A includes three buffer circuits.

The activation function circuit 12C can operate similarly to the activation function circuit 12B.

In the fourth embodiment, the combinational circuit 23A includes the first buffer circuit group 26 and the second buffer circuit group 27A on the input terminal side of the exclusive OR circuit 28. However, the present disclosure is not limited to this. The combinational circuit 23A may include one buffer circuit group on the output terminal side of the exclusive OR circuit 28 instead of the first buffer circuit group 26 and the second buffer circuit group 27A. This makes it possible to suppress the number of buffer circuits.

Fifth Embodiment

Figure 13:
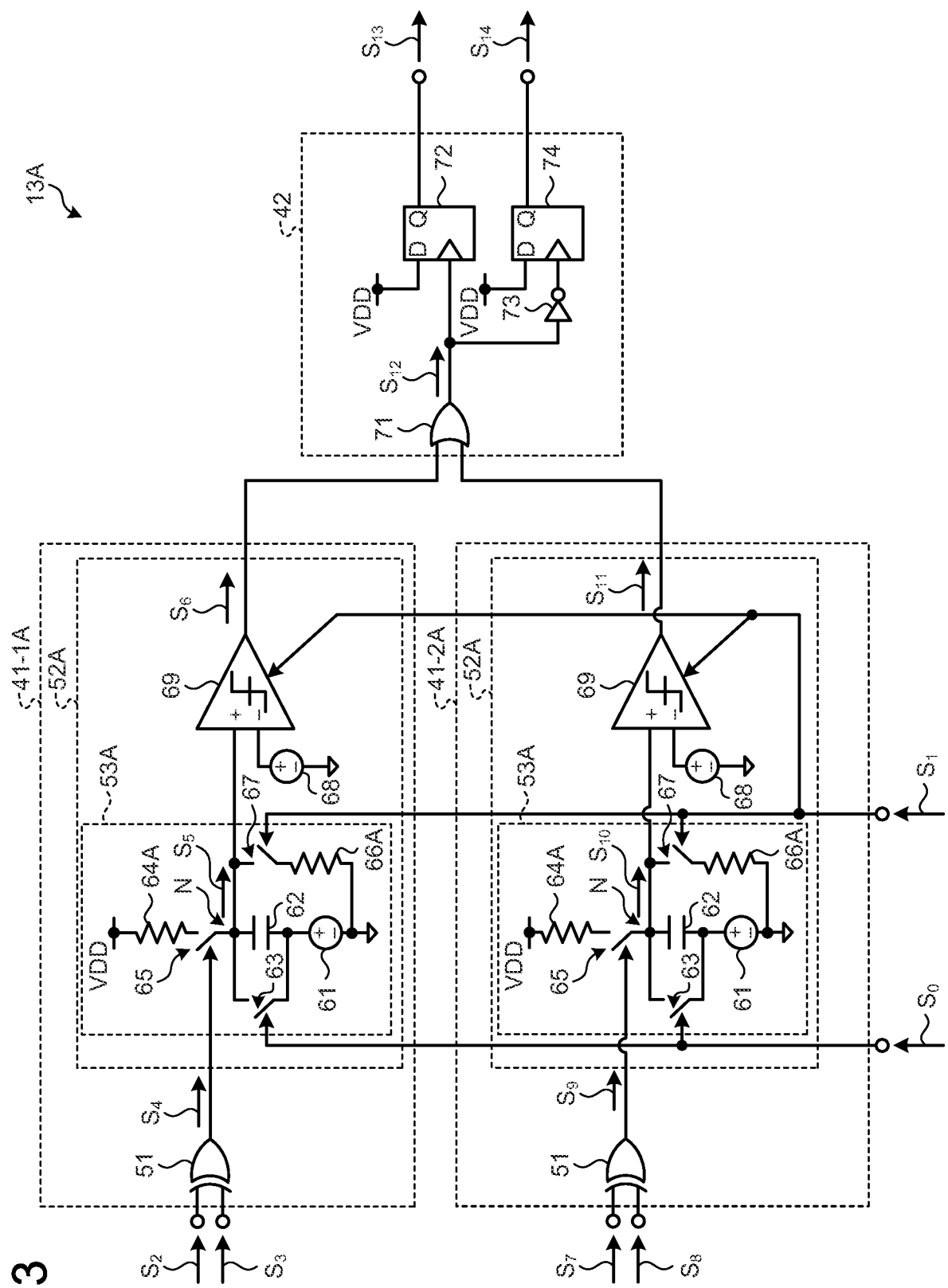
FIG. 13 is a diagram illustrating a configuration of a Max Pooling circuit according to a fifth embodiment of the present disclosure.

FIG. 13 is a diagram illustrating a configuration of a Max Pooling circuit according to a fifth embodiment of the present disclosure.

As compared with the Max Pooling circuit 13 (refer to FIG. 8) of the first embodiment, a Max Pooling circuit 13A includes first circuits 41-1A and 41-2A instead of the first circuits 41-1 and 41-2.

As compared with the first circuit 41-1 (refer to FIG. 8), the first circuit 41-1A includes a second time-length signal output circuit 52A instead of the second time-length signal output circuit 52.

As compared with the second time-length signal output circuit 52 (refer to FIG. 8), the second time-length signal output circuit 52A includes a charge/discharge circuit 53A instead of the charge/discharge circuit 53.

As compared with the charge/discharge circuit 53 (refer to FIG. 8), the charge/discharge circuit 53A includes a resistor 64A instead of the first constant current source 64. As compared with the charge/discharge circuit 53, the charge/discharge circuit 53A includes a resistor 66A instead of the second constant current source 66.

Since the circuit configuration of the first circuit 41-2A is similar to the circuit configuration of the first circuit 41-1A, the description thereof will be omitted.

When the first switch 65 turns on, the capacitor 62 is charged from the power supply potential VDD via the resistor 64A. Furthermore, when the second switch 67 turns on, the capacitor 62 is discharged via the resistor 66A.

Here, the resistance value of resistor 64A is Rcharge, the resistance value of resistor 66A is Rdischarge, and the capacitance value of capacitor 62 is C. The time constant of the RC series circuit formed with the resistor 64A and the capacitor 62 is (Rcharge*C). The time constant of the RC series circuit formed with the resistor 66A and the capacitor 62 is (Rdischarge*C). When the charge time is sufficiently shorter than the time constant (Rcharge*C) and the discharge time is sufficiently shorter than the time constant (Rdischarge*C), the following Formulas (5) and (6) hold as approximate equations.

$$Vc \approx ((VDD/Rcharge)/C)^* \Delta Tcharge + Vref \quad (5)$$

$$\Delta Tdischarge \approx (Vc - Vref)/(VDD/Rdischarge/C) = \\ (Rdischarge/Rcharge)^* \Delta Tcharge \quad (6)$$

In this manner, the Max Pooling circuit 13A can perform the operation similar to the Max Pooling circuit 13.

Furthermore, when it is adjusted as Rcharge<Rdischarge, the Max Pooling circuit 13A can set the time length ΔTdischarge longer than the time length ΔTcharge. That is, the Max Pooling circuit 13A can set the discharge time longer than the charge time. With this setting, the Max Pooling circuit 13A can also amplify the input time information.

Sixth Embodiment

Figure 14:
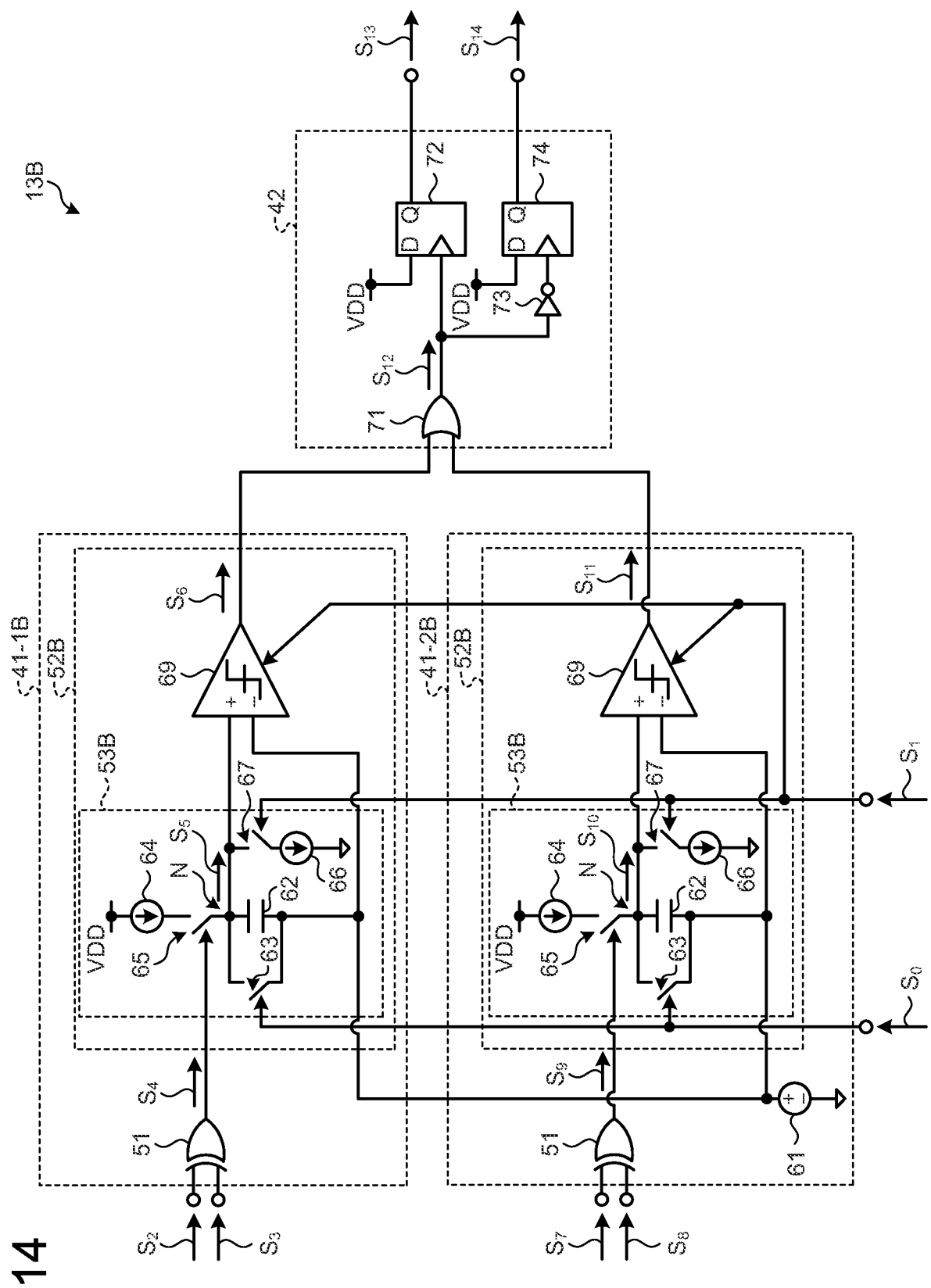
FIG. 14 is a diagram illustrating a configuration of a Max Pooling circuit according to a sixth embodiment of the present disclosure.

FIG. 14 is a diagram illustrating a configuration of a Max Pooling circuit according to a sixth embodiment of the present disclosure.

As compared with the Max Pooling circuit 13 (refer to FIG. 8) of the first embodiment, a Max Pooling circuit 13B includes first circuits 41-1B and 41-2B instead of the first circuits 41-1 and 41-2.

As compared with the first circuit 41-1 (refer to FIG. 8), the first circuit 41-1B includes a second time-length signal output circuit 52B instead of the second time-length signal output circuit 52.

As compared with the second time-length signal output circuit 52 (refer to FIG. 8), the second time-length signal output circuit 52B includes a charge/discharge circuit 53B instead of the charge/discharge circuit 53.

As compared with the charge/discharge circuit 53 (refer to FIG. 8), the charge/discharge circuit 53B does not include the first constant voltage source 61 or the second constant voltage source 68.

In both the first circuit 41-1B and the first circuit 41-2B, one end of the capacitor 62 of the charge/discharge circuit 53B and the inverting terminal of the comparator 69 are supplied with a reference potential Vref from one first constant voltage source 61.

Therefore, the Max Pooling circuit 13B can reduce the number of constant voltage sources as compared with the Max Pooling circuit 13.

Seventh Embodiment

Figure 15:
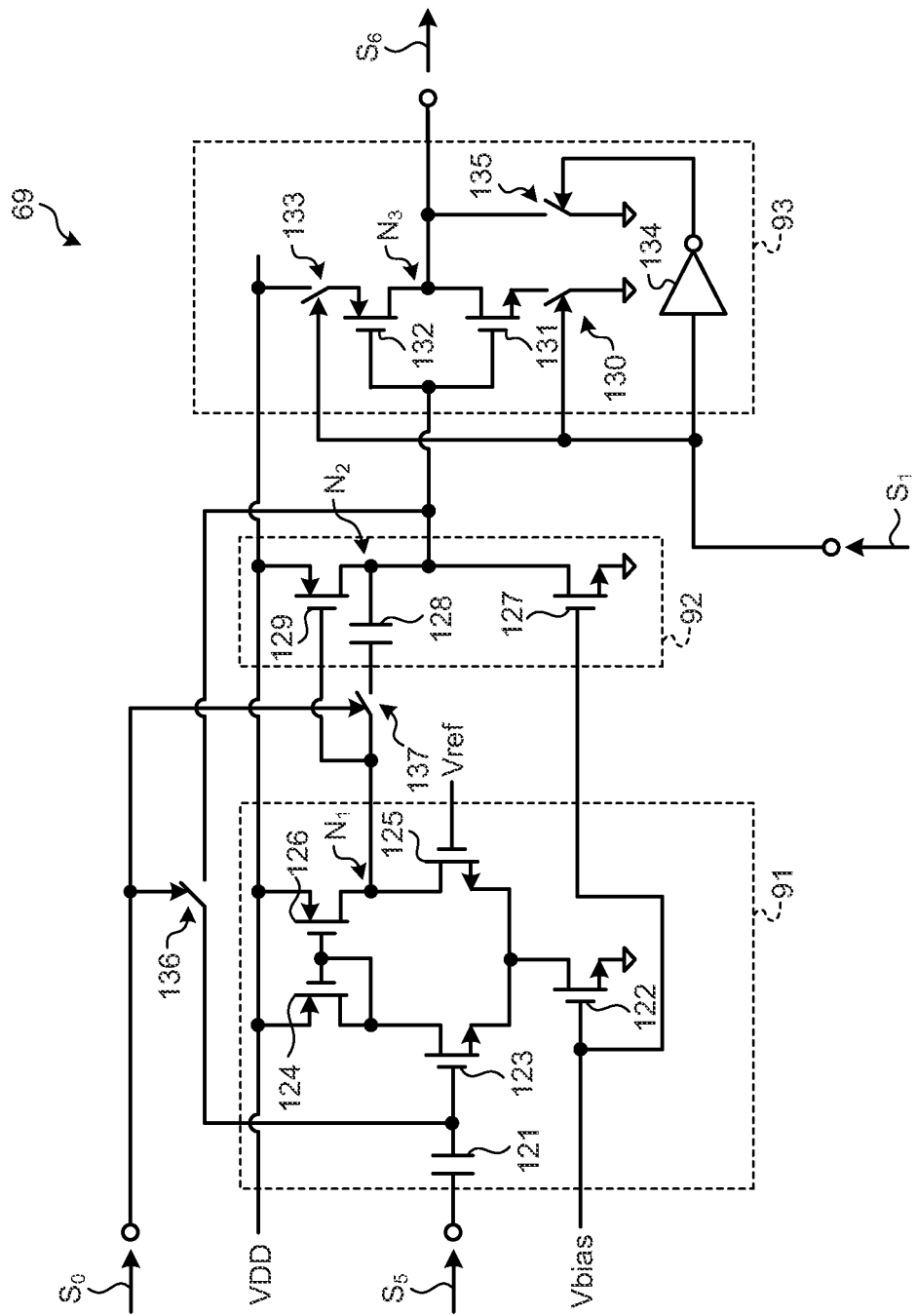
FIG. 15 is a diagram illustrating a configuration of a comparator of a Max Pooling circuit according to a seventh embodiment of the present disclosure.

FIG. 15 is a diagram illustrating a configuration of a comparator of a Max Pooling circuit according to a seventh embodiment of the present disclosure.

In each of the embodiments described above, in a case where a time length error due to an offset of the comparator 69 can be tolerated, the comparator 69 need not have an offset removing function. However, in a case where the time length error due to the offset of the comparator 69 is intolerable, it is preferable that the comparator 69 has an offset removing function as illustrated in FIG. 15.

The comparator 69 includes a first circuit 91, a second circuit 92, and a third circuit 93.

The first circuit 91, which is a differential pair circuit, includes a capacitor 121. The first circuit 91 further includes N-channel transistors 122, 123 and 125. The first circuit 91 further includes P-channel transistors 124 and 126.

The source of transistor 122 is connected to the standard potential. A predetermined bias potential Vbias is input to the gate of the transistor 122. The drain of transistor 122 is electrically connected to the source of transistor 123 and the source of transistor 125.

The signal $S_5$ is input to the gate of the transistor 123 via the capacitor 121, which is an input capacitor. The drain of transistor 123 is electrically connected to the drain and gate of transistor 124.

The source of transistor 124 is electrically connected to the power supply potential VDD.

The reference potential Vref is input to the gate of the transistor 125. The drain of transistor 125 is electrically connected to a node $N_1$.

The drain of transistor 126 is electrically connected to the node $N_1$. The gate of transistor 126 is electrically connected to the gate and drain of transistor 124. The source of transistor 126 is electrically connected to the power supply potential VDD.

The second circuit 92 includes an N-channel transistor 127, a P-channel transistor 129, and a capacitor 128.

The source of transistor 127 is electrically connected to the standard potential. The bias potential Vbias is input to the gate of the transistor 127. The drain of transistor 127 is electrically connected to a node $N_2$.

The drain of transistor 129 is electrically connected to the node $N_2$. The gate of transistor 129 is electrically connected to the node $N_1$. The source of transistor 129 is electrically connected to the power supply potential VDD.

One end of capacitor 128 is electrically connected to the node $N_2$. The other end of the capacitor 128 is electrically connected to the node $N_1$ via a switch 137. A signal $S_0$ being a reset signal is input to the control terminal of the switch 137.

The switch 136 is electrically connected between the gate of the transistor 123 and the node $N_2$. The signal $S_0$ being the reset signal is input to the control terminal of the switch 136.

The third circuit 93 includes switches 130, 133 and 135, an N-channel transistor 131, a P-channel transistor 132, and an inverting circuit (inverter circuit) 134.

The source of the transistor 131 is electrically connected to the standard potential via the switch 130. A signal $S_1$ being an enable control signal is input to the control terminal of the switch 130. The gate of the transistor 131 is electrically connected to the node $N_2$. The drain of the transistor 131 is electrically connected to a node $N_3$.

The drain of transistor 132 is connected to the node $N_3$. The gate of transistor 132 is electrically connected to the node $N_2$. The source of the transistor 132 is electrically connected to the power supply potential VDD via the switch 133. The signal $S_1$ is input to the control terminal of the switch 133.

The inverting circuit 134 inverts the signal $S_1$ and outputs the inverted signal $S_1$ to the control terminal of the switch 135. The switch 135 is electrically connected between the node $N_3$ and the standard potential.

The third circuit 93 outputs a signal $S_6$ from the node $N_3$.

In a case where the potential of the signal $S_5$ is lower than the reference potential Vref, the first circuit 91 being a differential pair circuit outputs a low-level signal from the node $N_1$. Furthermore, the first circuit 91 outputs a high-level signal from the node $N_1$ when the potential of the signal $S_5$ is the reference potential Vref or above.

In a case where a low-level signal has been input from the node $N_1$ in the second circuit 92, the transistor 129 turns on and outputs a high-level signal from the node $N_2$. Furthermore, in a case where a high-level signal has been input from the node $N_1$ in the second circuit 92, the transistor 129 turns off and outputs a low-level signal from the node $N_2$.

In the third circuit 93, when the signal $S_1$ which is the enable control signal is at a high level and the high-level signal has been input from the node $N_2$, the transistor 131 turns on and the low level signal $S_6$ is output from the node $N_3$.

In the third circuit 93, when the signal $S_1$ which is the enable control signal is at a high level and the low level signal has been input from the node $N_2$, the transistor 132 turns on and the high level signal $S_6$ is output from the node $N_3$.

When the signal $S_1$ which is the enable control signal falls to the low level, the transistors 131 and 132 turn off, the switch 135 turns on, and the node $N_3$ indicates the standard potential. Therefore, the third circuit 93 outputs the low level signal $S_6$ from the node $N_3$.

Furthermore, the comparator 69 uses the signal $S_0$, which is a reset signal, as an offset information acquisition signal. When a signal $S_0$ being the reset signal rises to a high level, the node $N_1$ and the node $N_2$ are electrically connected via the capacitor 128, and the node $N_2$ and the gate of the transistor 123 are electrically connected to each other.

As a result of this, the comparator 69 once holds the electric charge representing offset information of the comparator 69 in the capacitor 121. Thereafter, the comparator 69 performs a comparison operation between the signal $S_5$ and the reference potential Vref, achieving an offset-free comparator function.

The effects described in the present specification are merely examples, and thus, there may be other effects, not limited to the exemplified effects.

Note that the present technology can also have the following configurations.

(1)

A signal processing circuit which outputs, in a case where a first timing at which a first input signal changes is earlier than or same as a second timing at which a second input signal changes, a first output signal at the first timing and a second output signal at the second timing, and which outputs, in a case where the first timing is later than the second timing, the first output signal and the second output signal at the second timing.

(2)

The signal processing circuit according to (1), comprising a first logic circuit that performs a logical operation on the first input signal and the second input signal and outputs the first output signal.

(3)

The signal processing circuit according to (2), wherein the first logic circuit is a logical OR circuit that performs a logical OR operation on the first input signal and the second input signal and outputs the first output signal.

(4)

The signal processing circuit according to (2) or (3), wherein the second input signal is output as the second output signal.

(5)

The signal processing circuit according to (2) or (3), further comprising a second logic circuit that performs a logical operation on the second input signal and outputs the second output signal.

(6)

The signal processing circuit according to (5), wherein a circuit delay time of the second logic circuit is same as a circuit delay time of the first logic circuit.

(7)

The signal processing circuit according to (5) or (6),
wherein the second logic circuit is a logical OR circuit that performs a logical OR operation on the second input signal and the second input signal and outputs the second output signal.

(8)

The signal processing circuit according to any one of (2) to (7), further comprising:
a third logic circuit that performs a logical operation on the first output signal and the second output signal and outputs a timing signal indicating a timing of holding the first output signal and the second output signal;
a first sequential circuit that holds and outputs the first output signal based on the timing signal; and
a second sequential circuit that holds and outputs the second output signal based on the timing signal.

(9)

The signal processing circuit according to (8),
wherein each of the first sequential circuit and the second sequential circuit is a flip-flop.

(10)

A signal processing device comprising:
a multiply-accumulate operation circuit that performs a first multiply-accumulate operation of individually multiplying and adding a plurality of signals by coefficients of a first group and outputs a first signal and that performs a second multiple-accumulate operation of individually multiplying and adding the plurality of signals by coefficients of a second group and outputs a second signal; and
a signal processing circuit that outputs, in a case where a first timing at which the first signal changes is earlier than or same as a second timing at which the second signal changes, a first output signal at the first timing and a second output signal at the second timing, and that outputs, in a case where the first timing is later than the second timing, the first output signal and the second output signal at the second timing.

(11)

The signal processing device according to (10), further comprising
a second signal processing circuit that is electrically connected to a plurality of the signal processing circuits and that outputs the first output signal and the second output signal having a longest time length between a first timing at which the first output signal changes and a second timing at which the second output signal changes.

(12)

The signal processing device according to (10) or (11),
wherein the coefficients of the first group are coefficients individually representing positive loads, and
the coefficients of the second group are coefficients individually representing absolute values of negative loads.

(13)

A signal processing method comprising:
outputting, in a case where a first timing at which a first input signal changes is earlier than or same as a second timing at which a second input signal changes, a first output signal at the first timing and a second output signal at the second timing; and
outputting, in a case where the first timing is later than the second timing, the first output signal and the second output signal at the second timing.

REFERENCE SIGNS LIST

1 NEURAL NETWORK DEVICE
2 FIRST LAYER CIRCUIT
3 FIRST INTERLAYER CIRCUIT
4 SECOND LAYER CIRCUIT
5 SECOND INTERLAYER CIRCUIT
11 MULTIPLY-ACCUMULATE OPERATION CIRCUIT
11$p$ FIRST MULTIPLY-ACCUMULATE OPERATION CIRCUIT
11$m$ SECOND MULTIPLY-ACCUMULATE OPERATION CIRCUIT
12 ACTIVATION FUNCTION CIRCUIT
12A ACTIVATION FUNCTION CIRCUIT
12B ACTIVATION FUNCTION CIRCUIT
12C ACTIVATION FUNCTION CIRCUIT
13 MAX POOLING CIRCUIT
13A MAX POOLING CIRCUIT
13B MAX POOLING CIRCUIT
21 LOGICAL OR CIRCUIT
22 LOGICAL OR CIRCUIT
23 COMBINATIONAL CIRCUIT
23A COMBINATIONAL CIRCUIT
24 FIRST FLIP-FLOP
25 SECOND FLIP-FLOP
26 FIRST BUFFER CIRCUIT GROUP
27 SECOND BUFFER CIRCUIT GROUP
27A SECOND BUFFER CIRCUIT GROUP
28 EXCLUSIVE OR CIRCUIT
41-1 FIRST CIRCUIT
41-1A FIRST CIRCUIT
41-1B FIRST CIRCUIT
41-2 FIRST CIRCUIT
41-2A FIRST CIRCUIT
41-2B FIRST CIRCUIT
42 SECOND CIRCUIT
51 FIRST TIME-LENGTH SIGNAL OUTPUT CIRCUIT
52 SECOND TIME-LENGTH SIGNAL OUTPUT CIRCUIT
52A SECOND TIME-LENGTH SIGNAL OUTPUT CIRCUIT
52B SECOND TIME-LENGTH SIGNAL OUTPUT CIRCUIT
53 CHARGE/DISCHARGE CIRCUIT
53A CHARGE/DISCHARGE CIRCUIT
53B CHARGE/DISCHARGE CIRCUIT
69 COMPARATOR
91 FIRST CIRCUIT
92 SECOND CIRCUIT
93 THIRD CIRCUIT

The invention claimed is:
1. A signal processing circuit, comprising:
a first logic circuit configured to:
output, in a case where a first timing of a period is one of earlier or same as a second timing of the period, a first output signal at the first timing and a second output signal at the second timing, wherein
the first timing of the period corresponds to a timing at which a first input signal changes from a first state to a second state,
the second timing of the period corresponds to a timing at which a second input signal changes from a third state to a fourth state,
the first input signal is associated with the first output signal, and
the second input signal is associated with the second output signal; and output, in a case where the first timing of the period is later than the second timing of the period, each of the first output signal and the second output signal at the second timing.

2. The signal processing circuit according to claim 1, wherein the first logic circuit is further configured to:
perform a logical operation on the first input signal and the second input signal; and
output the first output signal based on the logical operation.

3. The signal processing circuit according to claim 2, wherein
the first logic circuit is a logical OR circuit, and
the first logic circuit is further configured to:
perform a logical OR operation on the first input signal and the second input signal; and
output the first output signal based on the logical OR operation.

4. The signal processing circuit according to claim 2, wherein the second input signal is output as the second output signal.

5. The signal processing circuit according to claim 2, further comprising a second logic circuit configured to:
perform a logical operation on the second input signal; and
output the second output signal based on the logical operation.

6. The signal processing circuit according to claim 5, wherein a circuit delay time of the second logic circuit is same as a circuit delay time of the first logic circuit.

7. The signal processing circuit according to claim 5, wherein
the second logic circuit is a logical OR circuit, and
the second logic circuit is further configured to:
perform a logical OR operation on the second input signal and the second input signal; and
output the second output signal based on the logical OR operation.

8. The signal processing circuit according to claim 2, further comprising:
a third logic circuit configured to:
perform a logical operation on the first output signal and the second output signal; and
output a timing signal that indicates a timing to hold each of the first output signal and the second output signal;
a first sequential circuit configured to:
hold the first output signal based on the timing signal; and
output the held first output signal; and
a second sequential circuit configured to:
hold the second output signal based on the timing signal; and
output the held second output signal.

9. The signal processing circuit according to claim 8, wherein each of the first sequential circuit and the second sequential circuit is a flip-flop.

10. A signal processing device, comprising:
a multiply-accumulate operation circuit configured to:
perform a first multiply-accumulate operation to:
individually multiply a plurality of signals by respective coefficients of a first group; and
add each of the multiplied plurality of signals associated with the respective coefficients of the first group;
output a first signal based on the addition associated with the first multiply-accumulate operation;
perform a second multiply-accumulate operation to:
individually multiply the plurality of signals by respective coefficients of a second group; and
add each of the multiplied plurality of signals associated with the respective coefficients of the second group; and
output a second signal based on the addition associated with the second multiply-accumulate operation; and
a first signal processing circuit configured to:
output, in a case where a first timing of a period the is one of earlier or same as a second timing of the period, a first output signal at the first timing and a second output signal at the second timing, wherein
the first timing of the period corresponds to a timing at which the first signal changes from a first state to a second state, and
the second timing of the period corresponds to a timing at which the second signal changes from a third state to a fourth state; and
output, in a case where the first timing is later than the second timing, each of the first output signal and the second output signal at the second timing.

11. The signal processing device according to claim 10, further comprising a second signal processing circuit configured to output a third output signal and a fourth output signal, wherein
each of the third output signal and the fourth output signal has a first time length longer than a second time length,
each of the first output signal and the second output signal has the second time length, and
each of the first time length and the second time length is between the first timing and the second timing.

12. The signal processing device according to claim 10, wherein
the coefficients of the first group individually represent positive loads, and
the coefficients of the second group individually represent absolute values of negative loads.

13. A signal processing method, comprising:
outputting, by a logic circuit, in a case where a first timing of a period is one of earlier or same as a second timing of the period, a first output signal at the first timing and a second output signal at the second timing, wherein
the first timing of the period corresponds to a timing at which a first input signal changes from a first state to a second state,
the second timing of the period corresponds to a timing at which a second input signal changes from a third state to a fourth state,
the first input signal is associated with the first output signal, and
the second input signal is associated with the second output signal; and
outputting, by the logic circuit, in a case where the first timing of the period is later than the second timing of the period, each of the first output signal and the second output signal at the second timing.

* * * * *